United States Patent [19]

Taylor

[11] 4,070,624

[45] Jan. 24, 1978

[54] APPARATUS FOR TESTING STARTERS AND ALTERNATORS

[75] Inventor: Clifford Taylor, Chicago, Ill.

[73] Assignee: American Generator & Armature Co., Chicago, Ill.

[21] Appl. No.: 709,001

[22] Filed: July 26, 1976

[51] Int. Cl.² ............................................. G01R 31/02
[52] U.S. Cl. ............................ 324/158 MG; 269/217; 322/99
[58] Field of Search ................. 324/158 MG; 322/99; 269/133, 217, 237, 238

[56] References Cited

U.S. PATENT DOCUMENTS

| | | | |
|---|---|---|---|
| 2,578,694 | 12/1951 | Goldman | 324/158 MG |
| 3,179,887 | 4/1965 | Crumbliss | 324/158 MG |
| 3,385,592 | 5/1968 | Hasell et al. | 269/217 |

Primary Examiner—Rudolph V. Rolinec
Assistant Examiner—Ernest F. Karlsen

Attorney, Agent, or Firm—Leydig, Voit, Osann, Mayer & Holt, Ltd.

[57] ABSTRACT

Test apparatus for electrically and mechanically testing the condition of alternators and starters used in automobiles, trucks and the like. The apparatus, in its preferred form, includes a pair of holding fixtures for securing a starter or alternator during test, the fixtures being configured to allow quick and easy insertion and removal of the unit. Electrical circuitry is connectable to the machine under test by quick connect leads, such as alligator clips, and includes interlocking switch means for allowing starters to be tested in one condition, and alternators in another condition. The electrical circuitry includes indicators for showing the electrical condition of the machine being tested. The apparatus is structured so that a device may be tested with a minimum of effort, allowing a typical test to be completed in less than a minute.

2 Claims, 5 Drawing Figures

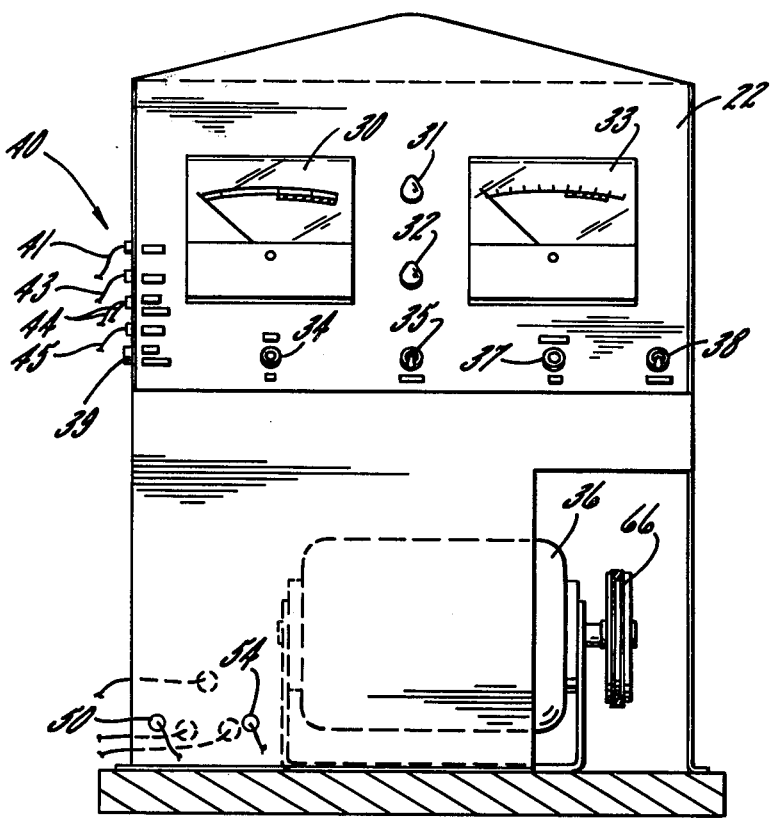
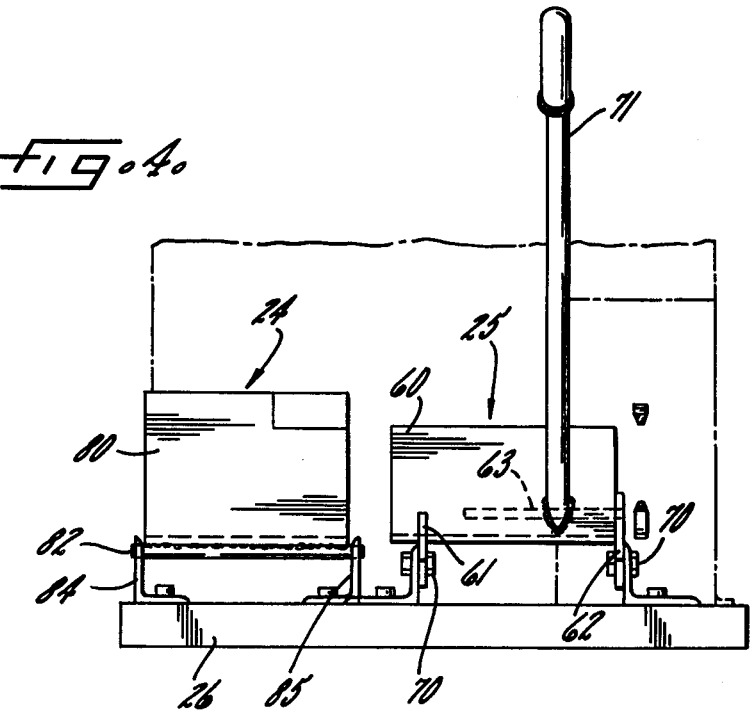

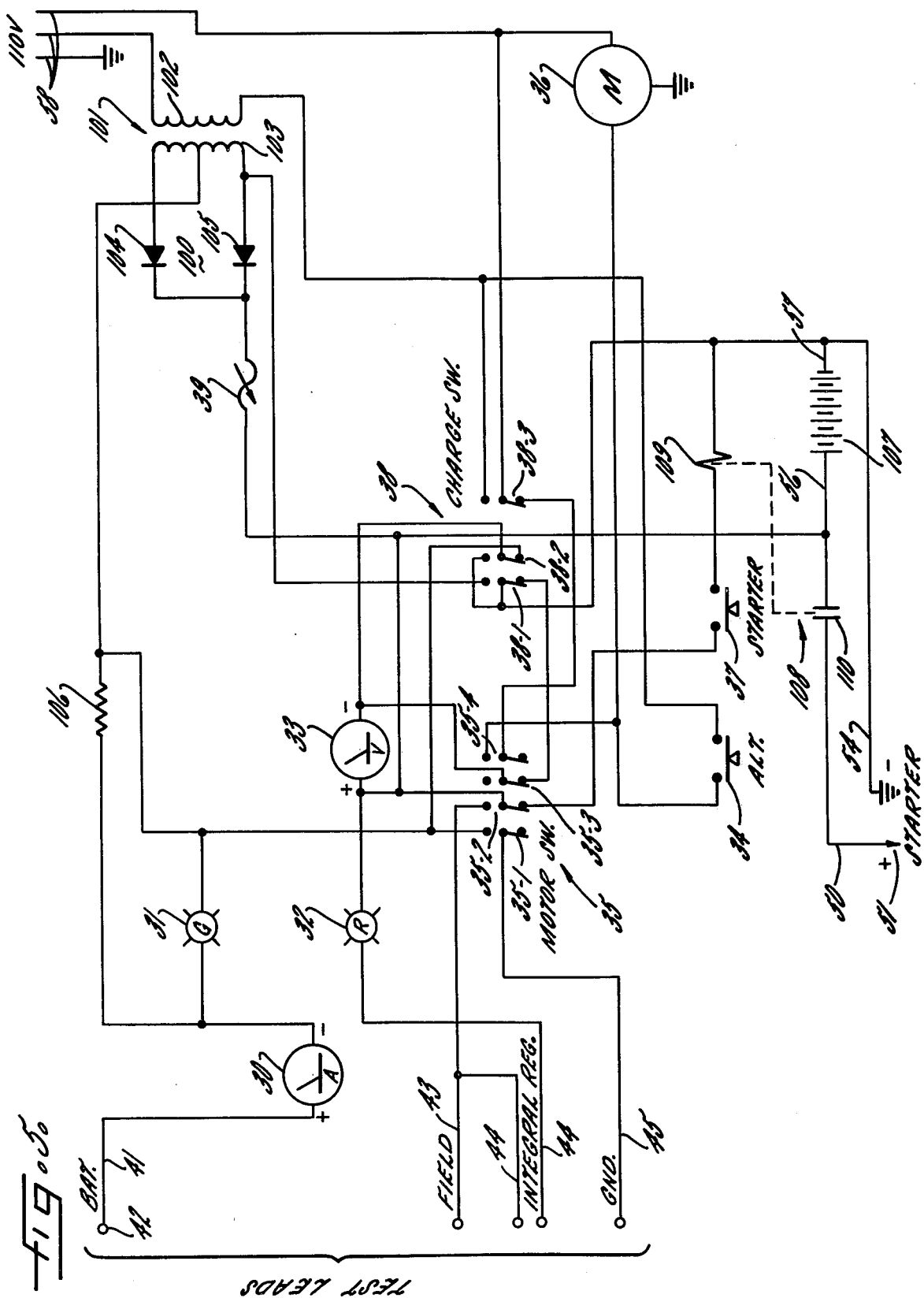

APPARATUS FOR TESTING STARTERS AND ALTERNATORS

This invention relates to test apparatus for rotating electrical machinery, and more specifically to apparatus for testing automotive alternators and starters.

In automotive maintenance, mechanics are generally capable of isolating a fault to a particular sub-system of the automobile, such as the charging circuit or the starting circuit, but many times are not able to isolate it to a single faulty component in the affected circuit. As a result, the mechanic often makes a reasoned judgment as to the faulty component, and simply replaces that component with a new or rebuilt unit to see if the fault is cured. Such an approach does not always meet with immediate success. Because of the relatively high cost of alternators and starters, the need exists for independently testing these units before replacing them as faulty.

Automotive repair centers very often ship faulty starters and generators to an outside vendor for rewinding and/or reconditioning, and use these reconditioned units for subsequent replacement. Because the units are relatively heavy, the need exists for pretesting the units to assure that they are faulty before shipping them out for reconditioning. Before rebuilding the unit, it would also be advantageous for the reconditioning plant to test the unit to assure that it is faulty before rebuilding or rewinding same. Additionally, as a means of quality control, the unit should be tested before reshipment or installation to assure that it is operational.

In short, major benefits would be achieved if it were possible to quickly and efficiently test the electrical and mechanical condition of suspect alternators or starters in a manner which would allow the result of the test to be understood by a class of mechanics ranging from highly skilled to relatively unskilled.

Accordingly, it is a general aim of the present invention to provide apparatus for individually testing motor vehicle alternators and starters to provide an easily understood indication of their electrical and mechanical condition, and to allow the test to be performed quickly and efficiently. An object, according to the present invention, is to provide such an apparatus having fixtures for securing the units to be tested, manually operable to receive a unit for test with minimum effort, adequately lock it in position during the test, and efficiently release it at the termination of the test.

According to one aspect of the invention, it is an object to provide a single tester capable of testing both starters and alternators, and having interlocking means in the electrical circuitry for allowing only one such test to be performed at any time. Because the starter test requires use of an automotive battery, it is a subsidiary object to provide a third condition for the electrical circuitry for charging the battery when the tester is not otherwise in use.

These and other objects will become apparent from the following description when taken in conjunction with the drawings in which:

FIG. 3 is a sectional view taken along the lines 3—3 of FIG. 2;

FIG. 4 is a fragmentary front elevation on an enlarged scale taken along the lines 4—4 of FIG. 2; and FIG. 5 is a schematic diagram showing one embodiment of an electrical circuit for the test apparatus of FIG. 1.

While the invention will be described in connection with a preferred embodiment, there is no intent to limit it to that embodiment. On the contrary, the intent is to cover all alternatives, modifications and equivalents included within the spirit and scope of the invention as defined by the appended claims.

Turning now to the drawings FIGS. 1-4 show the configuration of testing apparatus for rotating electrical machinery as used in automobiles, trucks, and the like. The rotating machinery of concern is specifically alternators and starters, the test apparatus being capable of efficiently mounting such machinery in test position, and performing a thorough test to provide an easily understandable indication of the operating condition of the machinery.

Figure 1:
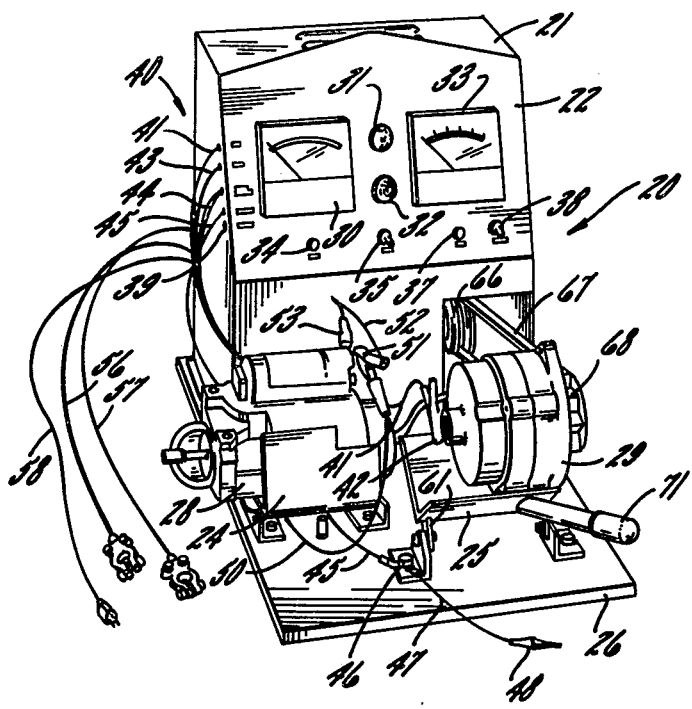
FIG. 1 is a perspective view showing test apparatus according to the present invention with a starter and a generator in position for test.

In more detail, the test apparatus, generally indicated at 20, includes an enclosure 21 for housing the electrical components of the apparatus and having a control panel 22 for supporting indicators, switches, and the like. A pair of fixtures 24, 25 are provided for receiving the electrical machinery to be tested, fixture 24 serving to hold a starter, and fixture 25 an alternator. Conveniently, both fixtures and the enclosure 21 are mounted on a single base support 26. For the purpose of illustrating the operation of the holding fixtures, FIG. 1 shows an automotive starter 28 mounted in the fixture 24 and an automotive alternator 29 mounted in the fixture 25.

Turning briefly to FIG. 3, the control panel 22 includes a plurality of indicators, shown herein as ammeter 30, indicator light 31 (preferably green), indicator light 32 (preferably red) and voltmeter 33. Such indicators operate during the test to be described below for showing the electrical condition of the unit under test. Switch means are also provided on the control panel 22 for conditioning the test apparatus to operate in its various modes, such switch means including alternator test pushbutton 34, motor switch 35 for controlling power to a motor 36 during the alternator test, starter test pushbutton 37, and charge switch 38 for conditioning the circuitry to charge an external battery. Conveniently mounted on the side of the casing 21 is a manually resettable circuit breaker 39. As will become more apparent during the description of the electrical circuitry, the unit is adapted to operate in three modes, with the desired mode selectable by the switches just described, such switches being electrically interlocked to prevent energization of two modes at the same time.

Connected to the electrical circuitry within the housing 21, to be described in detail below, are electrical leads having terminals thereon for attachment to the equipment to be tested. A grouping of leads indicated generally at 40 is provided for alternator testing including a battery lead 41 having an alligator clip 42 on the free end thereof for connection to the battery terminal of the alternator under test. A field lead 43 is provided having connectors thereon (hidden behind the alternator) for quick connection to the field terminal of the alternator. For use with certain alternators having integral regulators, a pair of leads 44 are provided having a single two terminal connector thereon (also hidden behind the alternator) for connection to the field and integral regulator terminals of such an alternator. Finally, a ground lead 45 is bolted at 46 directly to the alternator fixture for grounding the case of an alternator in contact therewith. A ground lead 47 having an alligator clip 48 on the free end thereof is provided for use with certain alternators having two field terminals so that a ground may be connected to one of such terminals for completing the field circuit.

For testing automotive starters, a single lead 50 is provided having an alligator clip 51 thereon for attachment to the battery post of the starter or, in cases where the starter includes an attached solenoid, to the battery post of the solenoid. In the latter case a second lead 52, electrically connected to the first, and having an alligator clip 53 thereon for attachment to the solenoid switch post is also provided. The electrical path to the starter under test is completed by way of a ground wire 54 (FIG. 3) electrically connected to the starter fixture 24 which, in turn, is in intimate contact with the case of the starter.

In the testing of automotive starters, a conventional automotive battery (not shown in FIGS. 1-4 but illustrated schematically at 107 in FIG. 5) is required. To accommodate this, a pair of battery cables 56, 57 are provided, having sufficient length for connection to a battery placed adjacent the test apparatus, and having the non-terminal ends thereof connected into the electrical circuitry as will be described in detail below. Finally, to power certain of the internal electrical elements a conventional line cord 58 is provided for connection to a standard 110 volt a.c. source.

One of the features of the instant test apparatus, namely the ability to quickly and efficiently set up a suspect unit for test, while being enhanced by the quick connect terminals described above, flows, in large part, from the fast acting holding fixtures now to be described. Referring first to the alternator fixture 25, it is seen that the structure includes a channel section 60 of steel or the like, having brackets 61, 62 affixed thereto as by welding. The bracket 62 carries an elongated post 63 within the channel, and extending generally parallel to the angle thereof. As is well known, the conventional automotive alternator includes a flange portion, generally secured to a clevis or bracket in an automobile for supporting the alternator while allowing it to be pivoted for tensioning the fan belt. This flange is conveniently used in the instant structure, the alternator being simply slid into the fixture 25 with the flange encompassing the post 63, the alternator case lying within the angle of the channel.

With the alternator slid into position as just described it is prepared to be driven to perform an operational test thereof. For providing a rotational drive, the casing 21 of the test apparatus holds an a.c. motor 36 having a drive pulley 66 engaging a V belt 67, the V belt projecting from the housing 21 so that it may be positioned over the driven pulley 68 of the alternator. The fixture supporting brackets 61, 62 are pivoted at 70, off center from the alternator engaging post 63, and a handle 71 is affixed to the channel 60, as by welding, so that once the drive belt 67 is engaged with the pulley of the alternator, simple pivoting of the handle 71 will serve to tension the belt and force the case of the alternator against the face 72 of the flange 60. Thus, the alternator is securely locked in position for test.

Figure 2:
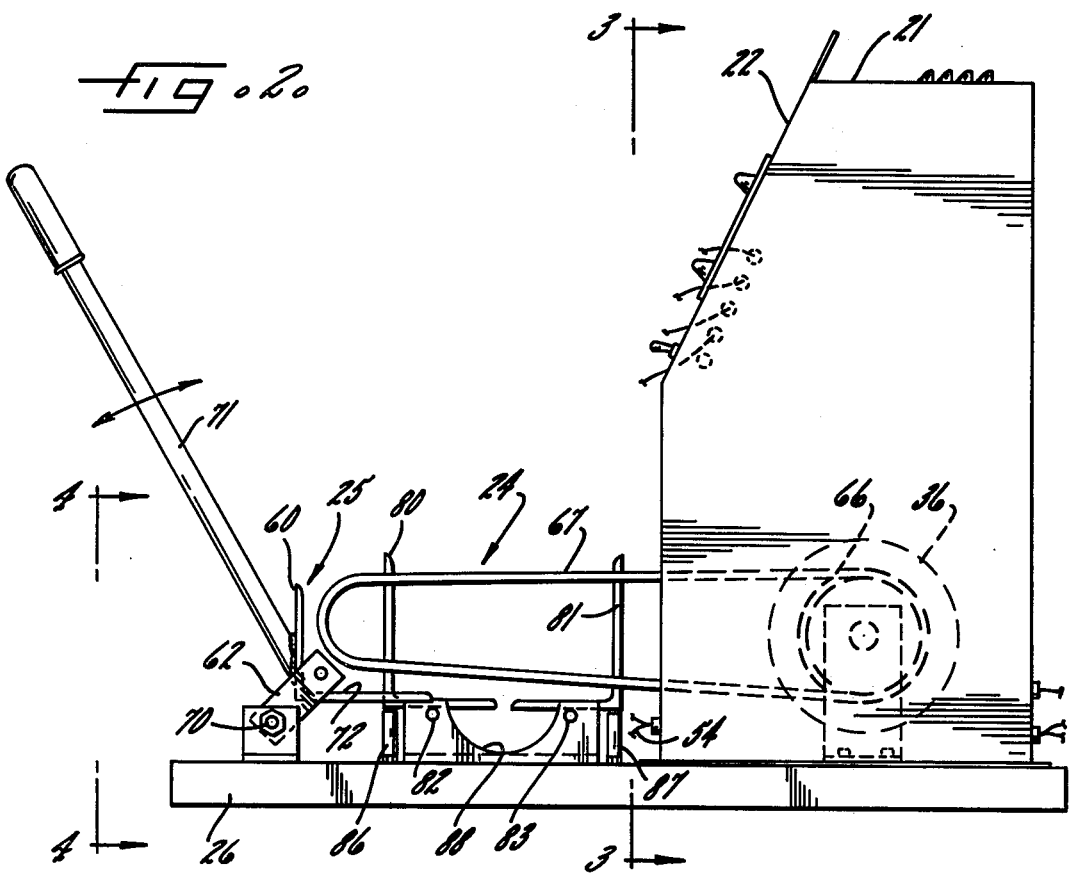
FIG. 2 is an end elevation of the apparatus of FIG. 1 with the starter and generator removed.

The starter motor fixture 24 includes a pair of channel members 80, 81 pivotably supported at 82, 83 respectively on a pair of base members, 84, 85. The pivots 82, 83 are preferably offset with respect to the center of gravity of the channel members 80, 81 so that the weight of such members biases them to the open position as shown in FIG. 2. A pair of stops 86, 87 may be provided for supporting the channel members 80, 81 with the upstanding portions thereof generally perpendicular to the base 26, and the lower portions of the respective channels forming a generally horizontal, but segmented surface. The base members 84, 85 are relieved as at 88 so that when a starter motor, such as 28, is placed in the vise, the channel members 80, 81 pivot about their centers 82, 83 to encompass the motor, allowing simple manual pressure on the starter or the fixture to restrain the starter in position during the test.

Turning attention to FIG. 5, there is shown in schematic form a circuit for use in a tester according to the invention. In addition to the elements previously enumerated, the electrical circuit shows a d.c. power supply generally indicated at 100, including a line transformer 101 having a primary 102 and a center tapped secondary 103, with a pair of diodes 104, 105 connected to the secondary as a full wave bridge and to the circuit breaker 39. A relatively low resistance high power resistor 106 is provided to serve as an alternator load during the alternator test. A conventional automotive battery 107 is connected to the battery cables 56, 57 as previously described. For coupling the battery to a starter under test, a conventional automotive solenoid 108 including coil 109 and contacts 110 is included in the circuit and enclosed within the electrical cabinet 21.

With the switches 35, 38 in the illustrated position, the unit is conditioned to test automotive starters, and operation in this mode will first be described. In short, a starter is tested by connecting the automotive battery to the starter, noting its mechanical operation, and observing the terminal voltage of the battery as an indication of the electrical condition of the starter. In this starter test mode, the charge mode and alternator test mode are disabled. For convenience, in describing the connections made through the switches 35, 38, the individual poles of each switch will be identified as 35-1 - 35-4 and 38-1 - 38-3 as indicated, with the center and lower contact of each pole being identified with the designator $a$, and the center and upper terminal of each pole being identified with the designator $b$. As shown in the diagram, the positive terminal of the voltmeter 33 is connected directly to the positive terminal of the battery 107. The negative terminal of the voltmeter is connected via contacts 35-3$a$ and 38-1$a$ to the negative terminal of the battery. It will be appreciated that were either switch 35 or 38 in the alternate position such connection would not be made. The negative terminal of the battery, as described above, is connected via wire 54 to the starter fixture. The positive terminal of the battery is connected to contacts 110 of the solenoid 108, and through such contacts, when closed, via cable 50 to connector 51 which is attached by the operator to the battery post of the starter. The solenoid coil 109 has a first terminal connected to the negative terminal of the battery, and a second terminal connected via normally open starter test switch 37 and contacts 35-2$a$ to the positive terminal of the battery. Thus, depression of the starter test switch 37 energizes the coil 109 which closes the contacts 110 to apply the potential of battery 107 to the starter. The meter 33 is imposed directly across the battery (via the aforementioned interlocking contacts) so that the terminal voltage of the battery while delivering current to the starter may be measured. If the battery terminal voltage remains above about 9 volts (which may be shown, for example, by a green shaded zone on the meter face) and the starter rotates properly, the unit is considered to be in good condition. If rotation does not occur, or the battery terminal voltage drops below 9 volts, the unit is considered to be defective.

While in the starter test mode the d.c. power supply 100 is maintained in the deenergized condition by virture of open contacts 38-3b, preventing operation of the charger. Similarly, contacts 35-3b prevent energization of the motor 36 and contacts 35-1b and 35-2b prevent energization of the field leads of the tester.

For operation in the charge mode the switch 35 is left in the illustrated position while the switch 38 is transferred to its opposite position. In this case the circuit for primary power to the transformer 101 is completed via contacts 38-3b, thereby energizing the rectifier. The negative terminal of the voltmeter 33 is connected to the negative terminal of the battery 107 via contacts 38-2b, thereby to measure the voltage of the battery. The center tap on the secondary 103 of the transformer 101 is maintained open by virtue of open contacts 35-1b. The bridge is adapted to trickle charge the battery, operating in half wave fashion by virtue of the connection between the anode of diode 105 and the negative terminal of the battery via contacts 38-1b. Thus, pulsating d.c. is fed to the battery for trickle charging same. Contacts 35-4b prevent energization of the motor 36 as in the starter test.

Finally, to set the apparatus up for testing an alternator, the motor switch 35 is transferred to its alternate position while the charger switch 38 is returned to the illustrated position. In this case the ground lead 45 (and thus the alternator fixture) is connected to the center tap of the transformer 101 via contacts 35-1b. Contacts 35-2b complete a circuit between the field connection 43 or 44 and the positive output of the d.c. supply 100 taken at circuit breaker 39. Contacts 35-4b supply a.c. current to the motor 36, energizing the same for rotation. Such current is supplied only if contacts 38-3a are closed (charger in the off position). With the fan belt engaged with the alternator under test, and the motor 36 rotating, the alternator test switch 34 is momentarily depressed completing the a.c. circuit to the primary of transformer 101. The d.c. supply 100 thus supplies current to the field of the alternator, causing it to generate current. If the alternator is operational current will flow through battery lead 41 and ammeter 30, through load 106 to ground (as provided through switch 35-1b). An operator may read the ammeter to determine if the alternator is generating sufficient current, an acceptable limit preferably being marked on the face of the ammeter 30, such as by a green shaded zone. The green indicator 31 is connected across the load 106 so that it will also glow to indicate proper operation of the alternator. If sufficient current is not produced, or if the indicator 31 does not glow, the operator is appraised that the alternator is faulty. The red indicator 32 is used only in cases of testing alternators with integral regulators, such indicator being connected in the path of current flow from the internal regulator of the alternator to the field thereof via contacts 35-2b, so that if the indicator 32 glows during testing of such an alternator an operator is appraised that the field is drawing excessive current, indicating a fault. During operation in the alternator test mode, charging is inhibited by virtue of the fact that contacts 38-1b and 35-3a are open, opening the circuit of the negative terminal of the battery 107. Similarly, testing of starters is inhibited by virtue of the fact that contacts 35-2a are open, preventing the application of power to starter test pushbutton 37.

In summary, in order to test an automotive alternator, the alternator 29 is simply slid into the fixture 25 over the post 63 and the fan belt 57 positioned over the driving pulley 56 and the driven pulley 58. Electrical leads 40, 41 or 42, and 44 if necessary, are connected to the appropriate terminals on the alternator. Slight manual pressure on the lever 71 serves to tension the fan belt 57. The switch 35 is then operated to energize the motor, thereby rotating the rotor of the alternator. The switch 34 is depressed and indicator 31 as well as the ammeter 30 observed for an indication of good or faulty operation. In the case of an alternator with integral regulator, the switch 34 is depressed only momentarily and if the unit is operating properly the indicator 31 should glow, the indicator 32 should be off and the ammeter 30 should read "in the green" until the switch 35 is again operated to deenergize the motor. After brief but thorough test the leads are disconnected from the ammeter and the ammeter simply slid from the fixture.

For testing a starter, the starter is simply placed in position on the vise 24, the weight of the starter tending to swing the vise to a closed position holding the same in position. The lead 50 is connected to the battery terminal of the starter. With the left hand placed lightly over the starter or the vise to maintain same in position, and both switches 35 and 38 in their lower position, the switch 37 is depressed and the meter 33 observed to assure that the indication is "in the green". Following the test the lead is simply disconnected and the starter lifted from the fixture.

When the unit is not in use the switch 35 is left in the lower position and the switch 38 in the upper position causing the circuitry described above to trickle charge the battery 107.

It will now be appreciated that what has been provided is a test apparatus for rotating machinery as used in motor vehicles, such apparatus allowing a thorough test to be carried out in a very brief period of time, and yielding an easily understood indication of the operability or non-operability of the unit under test.

I claim as my invention:

1. Test apparatus for rotating electrical machinery used in motor vehicle electrical systems comprising in combination, a first fixture for receiving an alternator to be tested, a motor having a drive belt for engaging a drive pulley of the alternator positioned in said fixture, said fixture having manually operable pivoting means for locking said alternator in said fixture and tensioning said belt, a second fixture for receiving a starter to be tested and operable to hold said starter during said test, and electrical circuitry for testing said machinery, electrical leads connected to said circuitry and having terminals thereon for connection to a starter or alternator to be tested, said circuitry including means for connection to a battery for testing said starter, means for energizing the field of said alternator for test, indicators for showing the condition of said machinery under test, and switch means for interlocking said circuitry having a first condition for enabling the testing of alternators while disabling the testing of starters, and a second condition for enabling the testing of starters while disabling the testing of alternators, whereby said rotating electrical machinery may be efficiently inserted, connected, tested and removed providing an indication of the operability thereof, said second fixture comprising a pair of substantially right angle channel sections independently pivoted to form a segmented lower surface enclosed by a pair of upstanding surfaces for receiving said starter, said pivots being located in the respective segments of the lower surface so that positioning a starter in said fixture causes said upstanding surfaces to pivot toward each other thereby to embrace said starter holding the same in position, said pivots being offset from the center of gravity of the associated channel member so that the fixture is automatically biased to an open position when said starter is removed, said alternator being of the type including a mounting flange, said first fixture including a post for slidably receiving said mounting flange and at least one supporting surface for supporting a portion of the alternator case when positioned on said post, said first fixture further including handle means for pivoting said fixture about a center offset from said post whereby said alternator is pivoted to tension said belt and force the case thereof against said supporting surface.

2. Apparatus as set forth in claim 1 wherein at least some of said electrical leads include alligator clips for affording quick connection to said machinery to be tested.

* * * * *